(12) United States Patent
Rohani et al.

(10) Patent No.: US 7,688,158 B2
(45) Date of Patent: Mar. 30, 2010

(54) DIGITALLY TUNED, INTEGRATED BALUNS WITH ENHANCED LINEARITY FOR MULTI-BAND RADIO APPLICATIONS

(75) Inventors: Nader Rohani, Scottsdale, AZ (US); Hongtao Xu, Beaverton, OR (US); Yulin Tan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 11/904,865

(22) Filed: Sep. 28, 2007

(65) Prior Publication Data

US 2009/0085689 A1 Apr. 2, 2009

(51) Int. Cl.
*H03H 11/32* (2006.01)
*H01P 5/10* (2006.01)
*H04B 1/50* (2006.01)

(52) U.S. Cl. .................................. 333/25; 333/101

(58) Field of Classification Search .................. 333/25, 333/26, 246, 247, 101, 103, 104, 105
See application file for complete search history.

(56) References Cited

U.S. PATENT DOCUMENTS

2008/0278258 A1* 11/2008 Liu .............................. 333/25

* cited by examiner

*Primary Examiner*—Dean O Takaoka
(74) *Attorney, Agent, or Firm*—The Law Offices of John C. Scott, LLC; John C. Scott (57) ABSTRACT

An integrated balun includes a low pass filter and a high pass filter that are formed on a semiconductor chip using tunable reactive elements. The outputs of the low pass filter and the high pass filter are tied together to form the single ended output of the balun. The inputs of the low pass filter and the high pass filter form the differential inputs of the balun. The low pass filter and the high pass filter each include a number of tunable networks for achieving the tunable reactive elements. Each tunable network includes at least one switching transistor and at least one fixed value reactive elements. In at least one embodiment, dynamic biasing circuitry may be provided to improve the linearity and reduce the insertion loss of the balun.

18 Claims, 5 Drawing Sheets

DIGITALLY TUNED, INTEGRATED BALUNS WITH ENHANCED LINEARITY FOR MULTI-BAND RADIO APPLICATIONS

TECHNICAL FIELD

The invention relates generally to radio frequency baluns and, more particularly, to baluns that can be tuned for operation within multiple different frequency bands.

BACKGROUND OF THE INVENTION

A balun is a transformer for transitioning between a balanced transmission line and an unbalanced (single ended) transmission line. Baluns are typically narrow band devices. For this reason, in multi-band radio applications, a separate balun is usually provided for each different band that is supported. Baluns are also commonly implemented "off chip" as large passive components. For these reasons, baluns will usually increase the size and cost of multi-band radio implementations. Techniques are required for reducing the size and cost of baluns within multi-band radio applications.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a digitally tuned, integrated balun circuit that is capable of operating within multiple different operational frequency bands. The balun may be used, for example, within a device carrying a multi-band radio to provide a transformation between a balanced transmission line and a single ended transmission line within multiple different bands. The balun circuit may be fully integrated on-chip. In at least one embodiment, the balun is implemented as part of a multi-band front end module (FEM) chip for use in a wireless device that supports multiple different wireless standards. Because only a single balun is needed for multiple supported frequency bands, overall circuit size and cost is reduced. Dynamic biasing circuitry may be provided within the balun to reduce insertion loss and enhance linearity.

Figure 1:
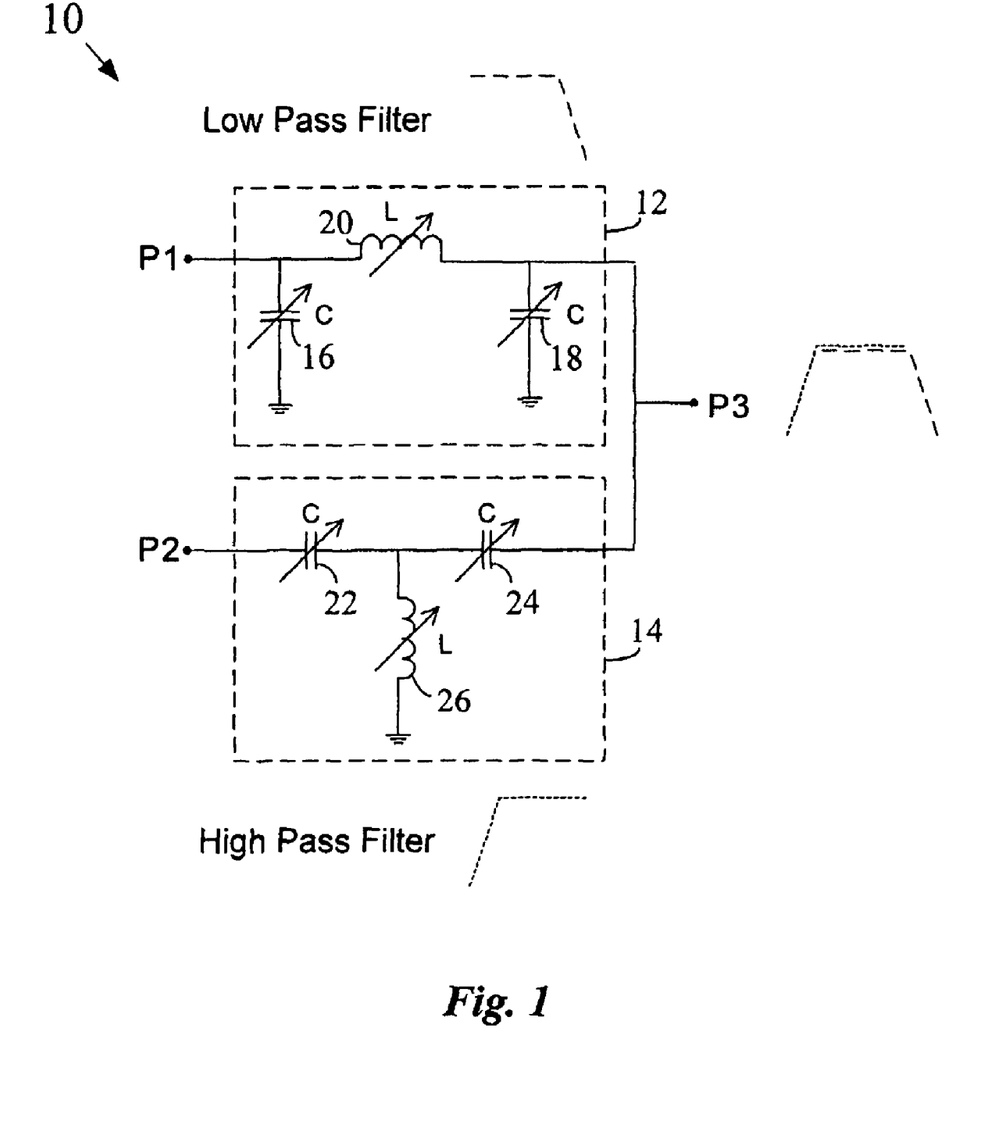
FIG. 1 is a schematic diagram illustrating an example multi-band balun in accordance with an embodiment of the present invention.

FIG. 1 is a schematic diagram illustrating an example multi-band balun 10 in accordance with an embodiment of the present invention. As shown, the balun 10 includes a low pass filter (LPF) 12 and a high pass filter (HPF) 14 that are coupled together at outputs thereof to form a single-ended balun output port (P3). The input of the LPF 12 forms one differential input port (P1) of the balun 10 and the input of the HPF 14 forms the other differential input port (P2) of the balun 10. In the illustrated embodiment, the LPF 12 is a pi-network having 2 shunt tunable capacitors 16, 18 that are coupled together by a series tunable inductor 20. The shunt capacitors 16, 18 have equal, but tunable, capacitances C and the inductor has a tunable inductance L. The HPF 14 in the illustrated embodiment is a T-network that includes two series tunable capacitors 22, 24 with a shunt tunable inductor 26 connected in between. The series capacitors 22, 24 have equal, but tunable, capacitances C that are the same, or approximately the same, as those of the capacitors 16, 18 in the LPF 12. That is, in some implementations, there may be slight differences in the capacitance values of the series capacitors 22, 24 and the capacitors 16, 18 to compensate for, for example, parasitic inductances and capacitances resulting from the inter-connects and traces on the layout. The shunt inductor 26 has a tunable inductance L that is the same, or approximately the same, as the series inductor 20 of the LPF 12. Again, there may be some slight differences in the inductance values to compensate for parasitic inductances and capacitances in the circuitry. Because the inductor and capacitor values are effectively the same in the LPF 12 and the HPF 14, an in-band phase shift difference of 180 degrees is achieved between the two differential paths. In other embodiments, alternative architectures may be used for the LPF 12 and the HPF 14. However, the architectures of the LPF 12 and the HPF 14 should be complementary and use the same C and L values, as in the architecture of FIG. 1.

In at least one embodiment of the present invention, the tunable reactive elements within the LPF 12 and the HPF 14 are achieved using on-chip tuning networks that include fixed-value reactive elements and switching transistors. Techniques for achieving fixed-value reactive elements on chip are well known in the art. The reactive elements within a tuning network may be connected in either a series or a parallel arrangement.

The multi-band balun 10 of FIG. 1 is capable of operation within multiple different operational frequency bands. These frequency bands may be associated with, for example, corresponding wireless standards (e.g., wireless networking standards, wireless cellular standards, etc.). When operation within a first band is desired, appropriate control information is delivered to the tuning networks of the multi-band balun 10 to tune the networks to achieve desired capacitance or inductance values. Typically, all of the tuning networks will be controlled in unison to change the tuning networks to the desired values. Once the capacitance and inductance values of the tuning networks have been changed, the balun should be operative within the desired band. When operation within another band is desired, different control information may be delivered to the tuning networks of the multi-band balun 10 to re-tune the networks for the new band. Because the LPF and the HPF are connected in parallel, the overall frequency response of the balun 10 will be that of a band pass filter. Additional filtering may be required, however, if the band pass response of the balun is not sufficiently narrow for the application.

In addition to the above, in some embodiments of the invention, dynamic bias control circuitry may be used in order to increase linearity and reduce insertion loss. The dynamic bias control circuitry can be used to, for example, achieve a maximum voltage swing across the switching transistor when in the "off" state to improve linearity. The dynamic bias control circuitry can also be used to, for example, achieve a reduced drain-source resistance in the switching transistors when in the on state to reduce the insertion loss of the balun.

Figure 2:
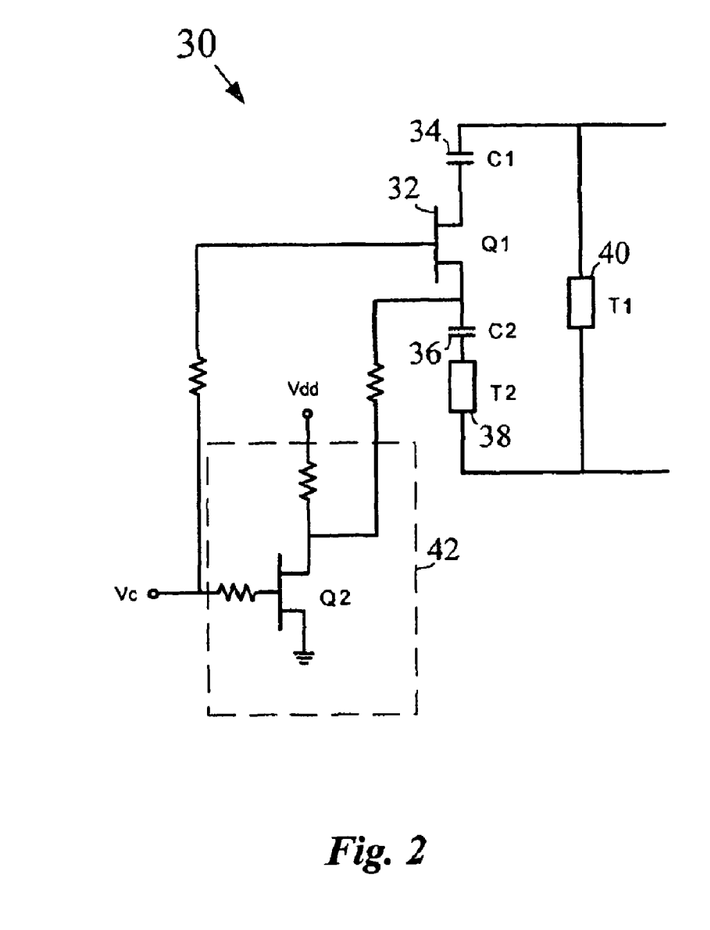
FIGS. 2 and 3 illustrate two example tuning network architectures for achieving a tunable reactive circuit element in accordance with embodiments of the present invention.
Figure 3:
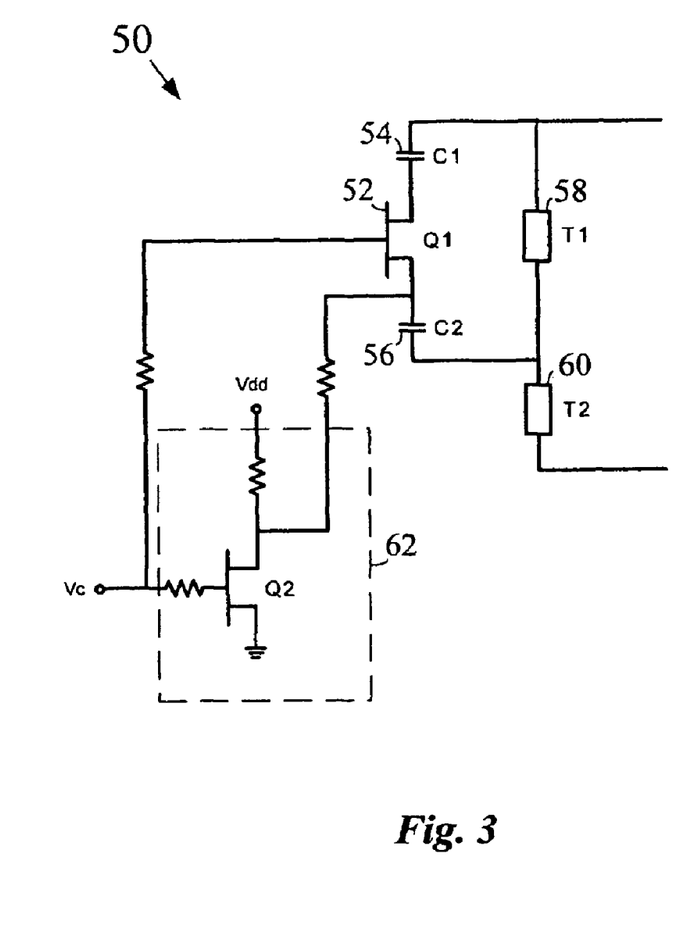
Figure 4:
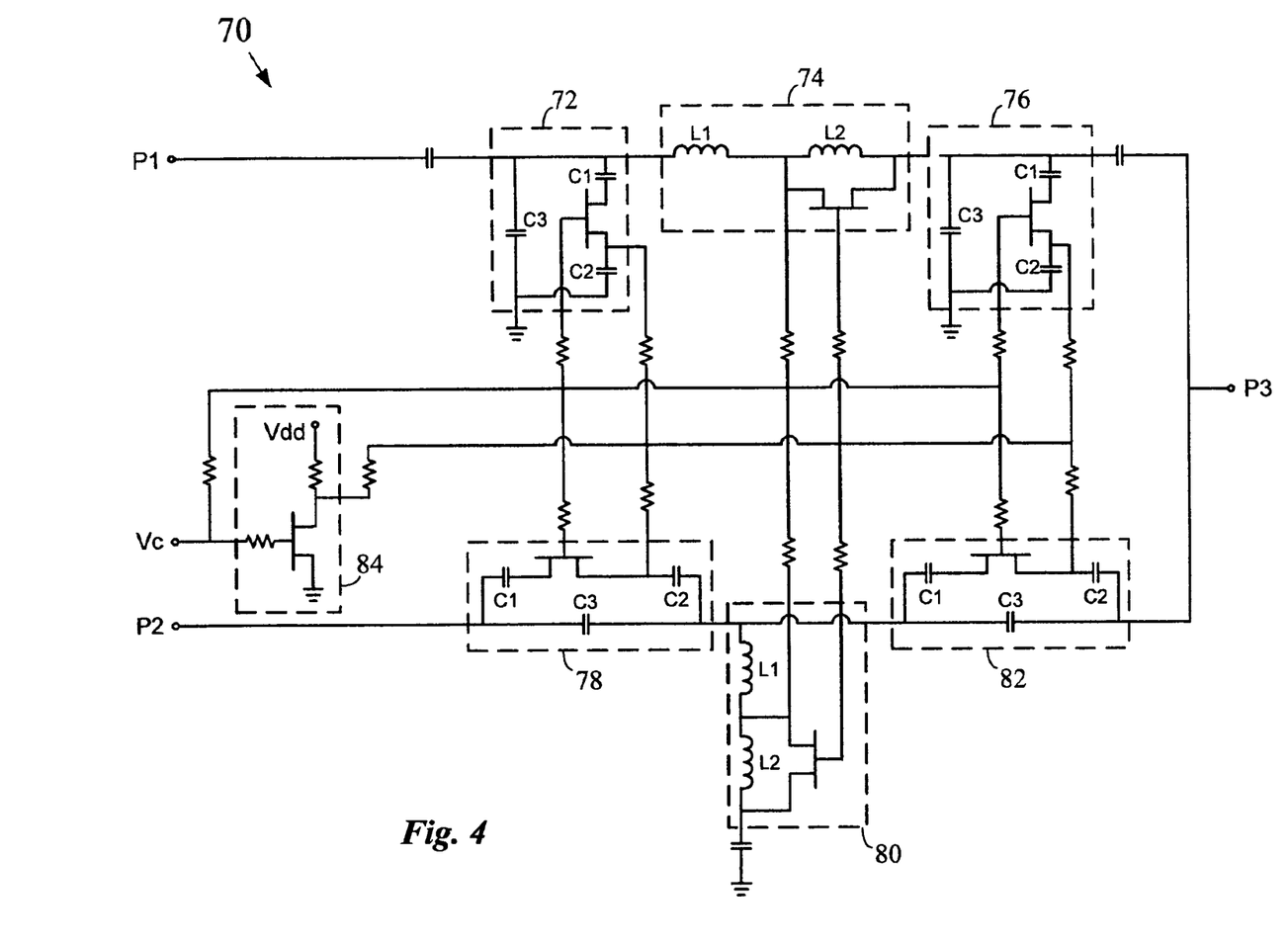
FIG. 4 is a schematic diagram illustrating an example balun in accordance with an embodiment of the present invention.
Figure 5:
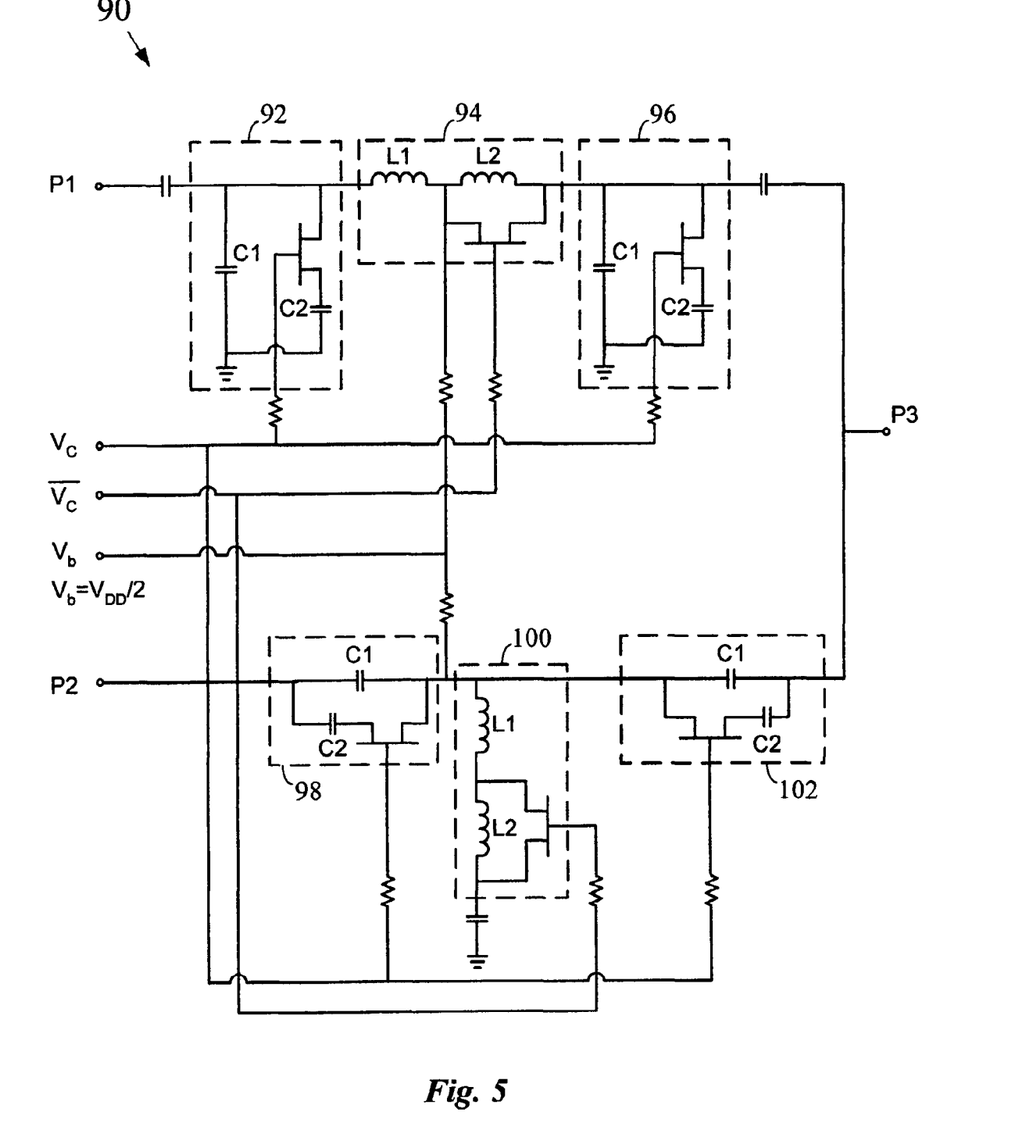
FIG. 5 is a schematic diagram illustrating an example balun in accordance with another embodiment of the present invention.

FIGS. 2 and 3 illustrate two example tuning network architectures for achieving a tunable reactive circuit element in accordance with embodiments of the present invention. FIG. 2 illustrates a parallel approach and FIG. 3 illustrates a series approach. As shown in FIG. 2, a parallel tuning network 30 may include: a switching transistor 32, a first capacitor 34 coupled to a drain terminal of the switching transistor 32, a second capacitor 36 coupled to a source terminal of the transistor 32, and first and second fixed-value reactive elements 38, 40. When the parallel tuning network 30 is acting as a tunable inductor, the first and second fixed-value reactive elements 38, 40 may both be inductors. When the parallel tuning network 30 is acting as a tunable capacitor, the first and second fixed-value reactive elements 38, 40 may both be capacitors, where the capacitor element 38 may be alternatively left out, as illustrated in FIG. 4 and FIG. 5, by incorporating its value into the parasitic capacitance of transistor element 32 together with blocking capacitor element 34 and 36.

As illustrated, the switching transistor 32, the first and second capacitors 34, 36, and the first fixed-value reactive element 38 are located within a first branch of the tuning network 30 and the second fixed-value reactive element 40 is located within a second, parallel branch of the tuning network 30. A control voltage $V_C$ may be applied to a gate terminal of the switching transistor 32 to control the overall capacitance or inductance of the tuning network 30. For example, if a logic high voltage (e.g., supply voltage $V_{DD}$) is applied to the gate terminal, the transistor 32 is turned "on" and a small "on" resistance appears between the drain and source terminals of the transistor 32. In this case, the tuning network 30 may, to a first order approximation, appear as a parallel combination of the first and second reactive elements 38, 40 (assuming the effect of the small resistance and the capacitors 34, 36 can be ignored). If a logic low voltage (e.g., zero volts) is applied to the gate terminal, then the transistor 32 is turned "off" and appears as an open circuit across its drain and source terminals. In this case, the tuning network 30 may appear as if only the second reactive element 40 is present.

As described above, if the tuning network 30 is being used to as a tunable capacitor, then the first fixed-value reactive element 38 may be left out of the network. That is, the capacitance value of the first element 38 may be incorporated into the other capacitors 34, 36 in the first branch of the network 30. In other embodiments, the parasitic capacitance of the off-state transistor may also be incorporated into the overall capacitance of the network 30.

To improve the linearity of the corresponding balun, linearity enhancement circuitry may be used within the tuning network 30. The linearity enhancement circuitry is designed to ensure that a maximum level of voltage swing is allowed across the switching transistor 32 when it is in an off state. The linearity enhancement circuitry may also provide a reduced drain-source resistance in the switching transistor 32 when it is in an on state, thereby reducing insertion loss. In the illustrated embodiment, an inverter 42 is used to provide linearity enhancement. The inverter 42 inverts the control voltage signal $V_C$ that is applied to the gate terminal of the switching transistor 32 and applies the inverted signal to the source of the switching transistor 32. To maximize linearity, the value of $|V_g - V_s|$ for the switching transistor 32 should be maximized to the power supply voltage level $V_{dd}$, where $V_g$ and $V_s$ are the voltages applied to the gate and source terminals of transistor 32, respectively. This condition may be realized by causing the source bias voltage of the switching transistor 32 to follow an inverted version of the gate control voltage $V_C$. The inverter 42 generates this inverted version of $V_C$. In the illustrated embodiment, the inverter 42 comprises a field effect transistor (FET) connected in a common source configuration. Other types of inverter circuits may alternatively be used.

When the switching transistor 32 is to be turned on, a logic high voltage (e.g., $V_{DD}$) is applied to its gate terminal and a logic low voltage (e.g., zero volts) is applied to its source terminal by the inverter 42. This effectively minimizes the on state resistance of the switching transistor 32 which translates into reduced balun insertion loss. When the switching transistor 32 is to be turned off, a logic low voltage is applied to the gate terminal of the transistor and a logic high voltage is applied to the source terminal by the inverter 42. As described above, this maximizes the allowable voltage swing of the off state transistor 32, thereby improving circuit linearity.

With reference to FIG. 3, a series tuning network 50 may include: a switching transistor 52, first and second capacitors 54, 56, and first and second fixed-value reactive elements 58, 60. The first and second fixed-value reactive elements 58, 60 will both be either capacitors or inductors. The switching transistor 52 and the first and second capacitors 54, 56 are located within a first branch of the tuning network 50. The first fixed-value reactive element 58 is located within a second, parallel branch of the tuning network 50. The second fixed-value reactive element 60 is located in series with the first fixed-value reactive element 58. When the tuning network 50 is acting as a tunable capacitor, the first and second fixed-value reactive elements 58, 60 may both be capacitors where the capacitor element 58 may be alternatively left out by incorporating its value into the parasitic capacitor of transistor element 52 together with blocking capacitor element 54 and 56.

As before, a control voltage $V_C$ may be applied to a gate terminal of the switching transistor 52 to control the overall capacitance or inductance of the tuning network 50. For example, if a logic high voltage (e.g., supply voltage $V_{DD}$) is applied to the gate terminal, the transistor 52 is turned "on" and appears as a small resistance between its drain and source terminals. In this case, the first fixed-value reactive element 58 is bypassed and the tuning network 50 may, as a first order approximation, appear as only the second fixed-value reactive element 60 (assuming the effect of the small on resistance and the capacitors 54, 56 can be ignored). If a logic low voltage (e.g., zero volts) is applied to the gate terminal, then the transistor 52 is turned "off" and appears as an open circuit between its drain and source terminals. In this case, the tuning network 50 may appear as the series combination of the first and second reactive elements 58, 60. As shown in FIG. 3, in at least one embodiment, the tuning network 50 includes an inverter 62 to perform linearity enhancement and reduce insertion loss for the corresponding balun. The inverter 62 operates in a similar fashion to the inverter 42 of FIG. 2. Other types of linearity enhancement circuitry may alternatively be used.

FIG. 4 is a schematic diagram of an example balun 70 in accordance with an embodiment of the present invention. As illustrated, the balun 70 includes first, second, third, fourth, fifth, and sixth tuning networks 72, 74, 76, 78, 80, 92. The first, second, and third tuning networks 72, 74, 76 form a low pass filter, such as LPF 12 of FIG. 1. The fourth, fifth, and sixth tuning networks 78, 80, 82 form a high pass filter, such as HPF 14 of FIG. 1. The first, third, fourth, and sixth networks 72, 76, 78, and 82 are each variable capacitance networks that use a parallel approach (as shown in FIG. 2). The second and fifth networks 74, 80 are each variable inductance networks that use a series approach (as shown in FIG. 3).

A control voltage $V_C$ is applied to the gate terminals of switching transistors within the first, third, fourth, and sixth networks 72, 76, 78, and 82 to turn the transistors on and off in a controlled manner. An inverter 84 is also provided to invert the control voltage $V_C$ to generate an inverted signal $\overline{V}_c$. The inverted signal $\overline{V}_c$ is applied to the source terminals of the first, third, fourth, and sixth networks 72, 76, 78, and 82 to provide linearity enhancement and insertion loss reduction. The inverted signal $\overline{V}_c$ is also applied to the gate terminals of the switching transistors within the second and fifth tuning networks 74, 80 to turn the corresponding transistors on and off in a controlled manner. The original signal $V_C$ is applied to the source terminals of these transistors to improve linearity and reduce insertion loss. The same capacitance values (C1, C2, and C3) are used within each of the first, third, fourth, and sixth networks 72, 76, 78, and 82. Similarly, the same inductance values $L_1, L_2$ are used within the second and fifth tuning networks 74, 76. When the instantaneous value of $V_C$ is logic high, the balun 70 will be operative within a first operational frequency range. When the instantaneous value of $V_C$ is logic low, the balun 70 will be operative within a second, different operational frequency range.

FIG. 5 is a schematic diagram illustrating an example balun 90 in accordance with another embodiment of the present invention. The balun 90 can be implemented on a semiconductor chip with less components (i.e., less DC blocking caps) than the balun 70 of FIG. 4. However, the balun 90 is not capable of achieving the level of linearity enhancement and insertion loss reduction that the balun of FIG. 4 can achieve. As illustrated, the balun 90 includes first, second, third, fourth, fifth, and sixth tuning networks 92, 94, 96, 98, 100, 102. The first, second, and third tuning networks 92, 94, 96 form a low pass filter and the fourth, fifth, and sixth tuning networks 98, 100, 102 form a high pass filter. The first, third, fourth, and sixth networks 92, 96, 98, and 102 are each variable capacitance networks that use a parallel approach and the second and fifth networks 94, 100 are variable inductance networks that use a series approach. As before, a control voltage $V_C$ is applied to the gate terminals of switching transistors within the first, third, fourth, and sixth networks 92, 96, 98, and 102 to turn the transistors on and off in a controlled manner. An inverter (not shown) is provided to invert the control voltage $V_C$ to generate an inverted signal $\overline{V}_c$. The inverted signal $\overline{V}_c$ is applied to the gate terminals of the switching transistors within the second and fifth tuning networks 94, 100 to turn the corresponding transistors on and off in a controlled manner.

In the embodiment of FIG. 5, a control voltage $V_b$ is also provided, in addition to $V_c$ and $\overline{V}_c$, that is equal to one half of the supply voltage $V_{DD}$. This voltage is applied to the drain or source terminals of the switching transistors within the second and fifth tuning networks 94, 100 to improve the linearity of the circuits and reduce insertion loss. In the fifth tuning network 100, the voltage $V_b$ reaches the drain or source terminal of the switching transistor through the inductor $L_1$ (which appears as a short circuit at DC). Because the first, third, fourth, and sixth networks 92, 96, 98, and 102 each use only one DC blocking capacitor (C2), instead of two, the voltage $V_b$ also appears on the drain or source terminals of the switching transistors in these networks to improve linearity and reduce insertion loss. However, because the voltage $V_b$ is only one-half of the supply voltage, a lower level of linearity enhancement and insertion loss reduction is achieved in the balun of FIG. 5 than in the balun of FIG. 4. As in the previous embodiment, when the instantaneous value of $V_C$ is logic high, the balun 90 will be operative within a first frequency band and when the instantaneous value of $V_C$ is logic low, the balun 90 will be operative within a second, different frequency band.

It should be appreciated that the baluns 70, 90 of FIGS. 4 and 5 represent two possible balun architectures in accordance with the present invention. Many other architectures may be used in other embodiments. For example, the baluns 70, 90 of FIGS. 4 and 5 use parallel capacitor tuning networks and series inductor tuning networks. In another approach, series capacitor tuning networks may be used with parallel inductor tuning networks. In addition, in other embodiments, additional tuning networks may be added to the LPF and the HPF. For example, with reference to FIG. 5, an additional series inductor can be added at the input and output of the LPF formed by tuning networks 92, 94, and 96 and an additional shunt inductor may be added at the input and output of the HPF formed by tuning networks 98, 100, 102. Other modifications and variations may also be made.

Figure 6:
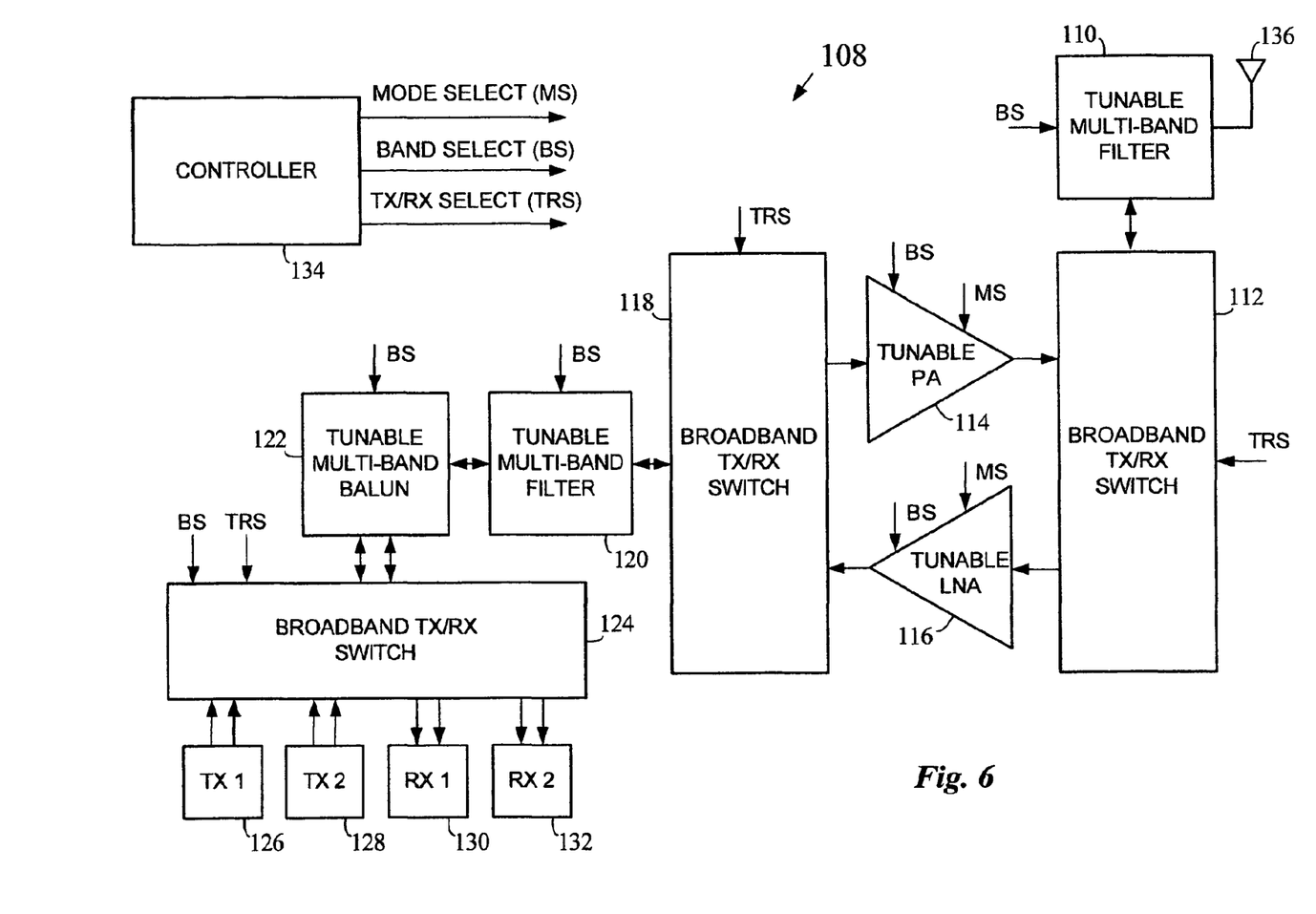
FIG. 6 is a block diagram illustrating an example multi-band transceiver that uses a tunable, multi-band balun in accordance with an embodiment of the present invention.

FIG. 6 is a block diagram illustrating an example multi-band transceiver 108 that uses a tunable, multi-band balun in accordance with an embodiment of the present invention. As shown, the multi-band transceiver 118 includes: first and second tunable, multi-band filters 110, 120; first, second, and third broadband transmit/receive (TX/RX) switches 112, 118, 124; a tunable multi-band, multi-mode power amplifier (PA) 114; a tunable multi-band, multi-mode low noise amplifier (LNA) 116; a tunable multi-band balun 122; first and second radio frequency (RF) transmitters 126, 128; first and second RF receivers 130, 132; and a controller 134. In addition, one or more antennas 136 may be provided to facilitate the reception of wireless signals from, and the transmission of wireless signals onto, the wireless medium. Any type of antenna(s) may be used including, for example, a dipole, a patch, a helical antenna, an antenna array, and/or others. In one approach, a wideband antenna is used that is operative across all of the frequency bands of the multi-band transceiver 108. In another approach, a tunable, multi-band antenna structure may be used.

The first RF transmitter 126 and the first RF receiver 130 may be operative within a first frequency band and the second RF transmitter 128 and the second RF receiver 132 may be operative within a second, different frequency band. These two frequency bands may correspond to, for example, two different wireless standards. The broadband TX/RX switches 112, 118, 124 are operative for configuring the transceiver 108 in either a transmit mode or a receive mode based on control information received from controller 134. When in receive mode, the broadband TX/RX switches 112, 118, 124 direct a signal received by the antenna 136 through the first tunable, multi-band filter 110, the tunable LNA 116, the second tunable, multi-band filter 120, and the tunable multi-band balun 122 to one of the two RF receivers 130, 132. When in transmit mode, the broadband TX/RX switches 112, 118, 124 direct a transmit signal generated by one of the RF transmitters 126, 128 through the tunable multi-band balun 122, the second tunable, multi-band filter 120, the tunable multi-band, multi-mode PA 114, and the first tunable, the multi-band filter 110 to the antenna 136 for transmission into the wireless channel.

The controller 134 controls the switching of the broadband TX/RX switches 112, 118, 124 and the tuning of the tunable, multi-band filters 110, 120 and the tunable multi-band balun 122. The controller 134 also controls the band and the mode of the tunable multi-band, multi-mode PA 114 and the tunable multi-band, multi-mode LNA 116. As shown, in at least one embodiment, the controller 134 generates a mode select (MS) control signal, a band select (BS) control signal, and a TX/RX select (TRS) signal that are distributed to the corresponding elements to control the operation thereof. The controller 134 may be implemented using, for example, a digital processing device such as, for example, a general purpose microprocessor, a digital signal processor (DSP), a microcontroller, a reduced instruction set computer (RISC), a complex instruction set computer (CISC), a field programmable gate array (FPGA), an application specific integrated circuit (ASIC), and/or others, including combinations of the above.

The first and second multi-band filters 110, 120 are each capable of changing between two different pass bands in response to the band select signal received from the controller 134. Likewise, the tunable multi-band balun 122 is able to switch between operation within two different frequency bands in response to the band select signal. The tunable multi-band balun 122 may be, for example, one of the baluns 70, 90 discussed previously or a similar structure. As illustrated, the single-ended port of the tunable multi-band balun 122 is connected to the second tunable, multi-band filter 120 and the differential port of the balun 122 is connected to the third broadband TX/RX switch 124. The first and second RF transmitters 126, 128 and the first and second RF receivers 130, 132 are all connected to the third broadband TX/RX switch 124 via differential connections. The first and second broadband TX/RX switches 112, 118 each perform only the transmit/receive switching function and thus receive only the TRS control signal. The third broadband TX/RX switch 124 also performs a band select function in addition to the transmit/receive switching function so that an appropriate transmitter or receiver is coupled through the switch 124 in response to the BS control signal.

The tunable multi-band, multi-mode PA 114 and the tunable multi-band, multi-mode LNA 116 are each capable of operation within multiple different bands and multiple different modes. As described above, the controller 134 may be used to configure the band and mode of these units using control signals (i.e., the BS signal and the MS signal. Although not illustrated, in at least one embodiment, the TRS signal may also be delivered to the tunable multi-band, multi-mode PA 114 and the tunable multi-band, multi-mode LNA 116 to be used to enable/disable the units during corresponding operating modes.

In at least one embodiment of the invention, the multi-band transceiver 108 is fully integrated on a single semiconductor chip. The antenna(s) 136 may be formed on the chip or may be connected externally. In other embodiments, one or more elements may be implemented off chip (e.g., the controller 134, the transmitters 126, 128, the receivers 130, 132, etc.). It should be appreciated that many other applications exist for the tunable, multi-band baluns of the present invention. The multi-band transceiver 108 of FIG. 6 represents one possible application.

The techniques and structures of the present invention may be implemented in any of a variety of different forms. For example, features of the invention may be embodied within laptop, palmtop, desktop, and tablet computers having wireless capability; personal digital assistants (PDAs) having wireless capability; cellular telephones and other handheld wireless communicators; pagers; satellite communicators; cameras having wireless capability; audio/video devices having wireless capability; network interface cards (NICs) and other network interface structures; base stations; wireless access points; integrated circuits; and/or in other formats.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A multi-band balun comprising:
a low pass filter having a number of tuning networks to achieve tunable reactive elements within the low pass filter, each tuning network in said low pass filter including at least one switching transistor and at least one fixed reactive element, wherein an input of said low pass filter forms a first differential port of said balun; and
a high pass filter having a number of tuning networks to achieve tunable reactive elements within the high pass filter, each tuning network in said high pass filter including at least one switching transistor and at least one fixed reactive element, wherein an input of said high pass filter forms a second differential port of said balun and an output of said high pass filter is coupled to an output of said low pass filter to form a single-ended port of said balun;
wherein said low pass filter and said high pass filter are integrated on a semiconductor chip.

2. The multi-band balun of claim 1, wherein:
a gate terminal of a first switching transistor within a first tuning network of said low pass filter is coupled to receive a control voltage signal $V_c$ to turn said first switching transistor off and on during balun operation to switch between operational bands; and
said multi-band balun further includes an inverter to invert said control voltage signal $V_c$ and to deliver said inverted version of said signal to a source terminal of said first switching transistor to improve linearity in said multi-band balun.

3. The multi-band balun of claim 2, wherein:
a gate terminal of a second switching transistor within a second tuning network of said low pass filter is coupled to receive said inverted version of said control voltage $V_C$; and
a source terminal of said second switching transistor within said second tuning network of said low pass filter is coupled to receive said control voltage $V_C$ to improve linear operation of said balun.

4. The multi-band balun of claim 1, wherein:
said low pass filter is arranged as a pi network having two shunt capacitive tuning networks coupled by a series inductive tuning network; and
said high pass filter is arranged as a T network having two series capacitive tuning networks with a shunt inductive tuning network there between.

5. The multi-band balun of claim 1, wherein:
a gate terminal of a first switching transistor within a first tuning network of said low pass filter is coupled to receive a control voltage signal $V_c$ to turn said first switching transistor off and on during balun operation to switch between operational bands; and
a source terminal of said first switching transistor is coupled to receive a control voltage $V_b$ that is approximately one-half of the supply voltage $V_{DD}$ of the balun to improve linear operation of the balun.

6. The multi-band balun of claim 5, further comprising:
an inverter to generate an inverted version of said control voltage $V_C$;
wherein a gate terminal of a second switching transistor within a second tuning network of said low pass filter is coupled to receive said inverted version of said control voltage $V_C$; and
a source terminal of said second switching transistor within said second tuning network of said low pass filter is coupled to receive said control voltage $V_b$ to improve linear operation of said balun.

7. The multi-band balun of claim 1, wherein:
said semiconductor chip is a front end module chip.

8. The multi-band balun of claim 1, wherein:
said low pass filter includes a first capacitive tuning network to achieve a tunable capacitance therein, said first capacitive tuning network including a first branch having a first switching transistor in series with at least one DC blocking capacitor and a second branch, in parallel with said first branch, having a fixed value capacitor, wherein a parasitic off-state capacitance of said first switching transistor acts as a reactive tuning element of said low pass filter when said first switching transistor is in an off state.

9. The multi-band balun of claim 8, wherein:
said low pass filter includes a second capacitive tuning network to achieve a tunable capacitance therein, said second capacitive tuning network including a third branch having a second switching transistor in series with at least one DC blocking capacitor and a fourth branch, in parallel with said third branch, having a fixed value capacitor, wherein a parasitic off-state capacitance of said second switching transistor acts as a reactive tuning element of said low pass filter when said second switching transistor is in said off state;
wherein said first capacitive tuning network and said second capacitive tuning network are each connected in shunt with a series inductive tuning network coupled there between.

10. A system comprising:
a tunable multi-band balun that can switch between at least first and second operational frequency bands in response to a control signal;
a broadband transmit/receive (TX/RX) switch coupled to a first differential port of said tunable multi-band balun; and
first and second radio frequency transmitters and first and second radio frequency receivers coupled to differential ports of said broadband TX/RX switch, said first radio frequency transmitter and said first radio frequency receiver operable in a first frequency band and said second radio frequency transmitter and said second radio frequency receiver operable in a second frequency band that is different from said first frequency band, wherein said broadband TX/RX switch is configured to couple one of said first radio frequency transmitter, said second radio frequency transmitter, said first radio frequency receiver, and said second radio frequency receiver through to said first differential port based on control signals.

11. The system of claim 10, wherein said tunable multi-band balun comprises:
a low pass filter having a number of tuning networks to achieve tunable reactive elements within the low pass filter, each tuning network in said low pass filter including at least one switching transistor and at least one fixed reactive element, wherein an input of said low pass filter forms a first differential port of said multi-band balun; and
a high pass filter having a number of tuning networks to achieve tunable reactive elements within the high pass filter, each tuning network in said high pass filter including at least one switching transistor and at least one fixed reactive element, wherein an input of said high pass filter forms a second differential port of said multi-band balun and an output of said high pass filter is connected to an output of said low pass filter to form a single-ended port of said multi-band balun.

12. The system of claim 11, wherein:
a gate terminal of a first switching transistor within a first tuning network of said low pass filter is coupled to receive a control voltage signal $V_c$ to turn said first switching transistor off and on during balun operation to switch between operational frequency bands; and
said multi-band balun further includes an inverter to invert said control voltage signal $V_c$ and to deliver said inverted signal to a source terminal of said first switching transistor to improve linearity in said multi-band balun.

13. The system of claim 12, wherein:
a gate terminal of a second switching transistor within a second tuning network of said low pass filter is coupled to receive said inverted version of said control voltage $V_C$; and
a source terminal of said second switching transistor within said second tuning network of said low pass filter is coupled to receive said control voltage $V_C$ to improve linear operation of said balun.

14. The system of claim 11, wherein:
said low pass filter is arranged as a pi network having two shunt capacitive tuning networks coupled by a series inductive tuning network; and
said high pass filter is arranged as a T network having two series capacitive tuning networks with a shunt inductive tuning network connected there between.

15. The system of claim 11, wherein:
a gate terminal of a first switching transistor within a first tuning network of said low pass filter is coupled to receive a control voltage signal $V_c$ to turn said first switching transistor off and on to tune said multi-band balun between multiple different frequency bands; and
a source terminal of said first switching transistor is coupled to receive a control voltage $V_b$ that is approximately one-half of the supply voltage $V_{DD}$ of the balun to improve linear operation of the balun.

16. The system of claim 15, further comprising:
an inverter to generate an inverted version of said control voltage $V_C$;

wherein a gate terminal of a second switching transistor within a second tuning network of said low pass filter is coupled to receive said inverted version of said control voltage $V_C$; and a source terminal of said second switching transistor within said second tuning network of said low pass filter is coupled to receive said control voltage $V_b$ to improve linear operation of said balun.

17. The system of claim 11, wherein:

said low pass filter includes a first capacitive tuning network to achieve a tunable capacitance therein, said first capacitive tuning network including a first branch having a first switching transistor in series with at least one DC blocking capacitor and a second branch, in parallel with said first branch, having a fixed value capacitor, wherein a parasitic off-state capacitance of said first switching transistor acts as a reactive tuning element of said low pass filter when said first switching transistor is in an off state.

18. The system of claim 17, wherein:

said low pass filter includes a second capacitive tuning network to achieve a tunable capacitance therein, said second capacitive tuning network including a third branch having a second switching transistor in series with at least one DC blocking capacitor and a fourth branch, in parallel with said third branch, having a fixed value capacitor, wherein a parasitic off-state capacitance of said second switching transistor acts as a reactive tuning element of said low pass filter when said second switching transistor is in said off state;

wherein said first capacitive tuning network and said second capacitive tuning network are each connected in shunt with a series inductive tuning network coupled there between.

* * * * *